United States Patent
Zhao

(10) Patent No.: US 9,391,188 B2
(45) Date of Patent: Jul. 12, 2016

(54) SEMICONDUCTOR DEVICE AND METHOD FOR FABRICATING SEMICONDUCTOR DEVICE

(71) Applicant: Semiconductor Manufacturing International (Shanghai) Corporation, Shanghai (CN)

(72) Inventor: Meng Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 13/916,890

(22) Filed: Jun. 13, 2013

(65) Prior Publication Data

US 2013/0341688 A1 Dec. 26, 2013

Related U.S. Application Data

(62) Division of application No. 13/243,218, filed on Sep. 23, 2011, now Pat. No. 8,841,187.

(30) Foreign Application Priority Data

May 9, 2011 (CN) .......................... 2011 1 0117441

(51) Int. Cl.
*H01L 29/78* (2006.01)
*H01L 29/66* (2006.01)
*H01L 29/06* (2006.01)

(52) U.S. Cl.
CPC ............ *H01L 29/78* (2013.01); *H01L 29/0653* (2013.01); *H01L 29/66636* (2013.01); *H01L 29/7833* (2013.01)

(58) Field of Classification Search
CPC ............ H01L 29/0653; H01L 29/6659; H01L 29/6628; H01L 21/02433; H01L 29/78; H01L 29/7833; H01L 29/66636
USPC .......................................... 257/327; 438/294
See application file for complete search history.

(56) References Cited

U.S. PATENT DOCUMENTS

| 6,083,796 A * | 7/2000 | Park .................. H01L 29/0653 257/E29.021 |
| 2007/0012994 A1* | 1/2007 | Chou .................. H01L 29/0653 257/327 |
| 2008/0006854 A1* | 1/2008 | Luo .................. H01L 29/66636 257/288 |
| 2011/0024806 A1 | 2/2011 | Radic et al. .................. 257/288 |
| 2011/0031535 A1 | 2/2011 | Iwamatsu .................. 257/203 |

FOREIGN PATENT DOCUMENTS

CN 1848431 A 10/2006
CN 101740393 A 6/2010

OTHER PUBLICATIONS

Office Action issued for priority CN application No. 201110117441.6 issued May 6, 2014.

* cited by examiner

*Primary Examiner* — Kenneth Parker
*Assistant Examiner* — Bo Fan
(74) *Attorney, Agent, or Firm* — Koppel, Patrick, Heybl & Philpott

(57) ABSTRACT

Disclosed is a semiconductor device and a method for fabricating the semiconductor device. The method for fabricating the semiconductor device comprises steps of: forming a side cliff in a substrate in accordance with a gate mask pattern, the side cliff being substantially vertical to a substrate surface; forming a dielectric layer on the substrate that comprises the side cliff; etching the dielectric layer to have the dielectric layer left only on the side cliff, as a dielectric wall; and burying the side cliff by a substrate growth, the burying is performed up to a level higher than the upper end of the dielectric wall.

6 Claims, 5 Drawing Sheets

SEMICONDUCTOR DEVICE AND METHOD FOR FABRICATING SEMICONDUCTOR DEVICE

CROSS REFERENCE WITH RELATED APPLICATIONS

This application is a divisional application from, and claims the benefit of, U.S. patent application Ser. No. 13/243,218 to Zhao, also entitled "Semiconductor Device and Method for Fabricating Semiconductor Device," which claims the priority of Chinese patent application No. 201110117441.6 filed on May 9, 2011, which is incorporated in its entirety herein by reference.

BACKGROUND OF THE INVENTION

1. Field of the Invention

The present invention relates to a semiconductor device and a method for fabricating the semiconductor device. More specifically, the present disclosure relates to a metal oxide semiconductor field effect transistor (MOSFET) and a fabricating method therefor.

2. Description of the Related Art

In recent years, with the demand for downsizing electronic apparatuses, dimensions of semiconductor devices such as field effect transistors (e.g. metal oxide semiconductor field effect transistor) are also being scaled down drastically, and a size of a channel is also decreased accordingly.

When the size of the channel is decreased to a certain degree, depletion regions of a source region and a drain region take a larger proportion of the whole channel and are close to each other in the transverse direction (lateral direction), and thus the short channel effect (SCE) occurs.

The effects caused by the short channel effect can be mitigated to some extent by decreasing the thickness of gate oxide and decreasing the gate voltage. However, since breakdown prevention performance and operation performance have to be taken into consideration, the thickness of gate oxide and the gate voltage cannot be scaled down in proportion to the overall dimension of the metal oxide semiconductor field effect transistor when the dimension of the semiconductor device is scaled down to a certain dimension. Therefore, other methods for suppressing the short channel effect must be sought.

SUMMARY OF THE INVENTION

In order to ensure sufficient working current for a semiconductor device, the source and drain doped regions (i. e. active regions) of the substrate is required to have a sufficiently low resistance value. In order to make the active regions of a device having a relatively small dimension have a low resistance value, a higher doping concentration and a higher impurity activation temperature (annealing temperature) are required as compared to the case of a device having a relatively large dimension. However, the higher doping concentration and the higher impurity activation temperature (annealing temperature) may cause lateral diffusion of dopants in the source and drain regions, which causes a drain induction barrier lower (DIBL) effect on the surface of the channel and thereby an increase of a leakage current or a channel punch-through may occur. This further deteriorates the short channel effect, and the performance of the semiconductor device degrades accordingly. Preventing the lateral diffusion of the dopants by decreasing doping concentration in the source and drain doped regions can increase the resistance value of the source and drain doped regions, which makes the carrier mobility decrease.

Furthermore, there has been proposed in the prior art to use an ultra shallow junction (USJ) method and the like to reduce the lateral diffusion of the dopants. In addition, low-energy light doped regions (LDD) and a co-implantation of a pre-amorphization implantation (PAI) have been adopted to optimize doping profiles of the light doped regions and halo regions to improve the performance of the device. However, in the case where the dimension of the semiconductor device is scaled down, these methods cannot satisfactorily suppress the lateral diffusion of dopants in the source and drain regions, but make it remarkably more difficult to suppress the drain junction capacitance and junction leakage current, especially for NMOS transistors with two-step-implantation in the drain and the source.

As described above, the inventor of the present invention has found that it is still a tough problem to be solved for the prior art to prevent the lateral diffusion of dopants in the source and drain regions.

In order to solve the above mentioned problem, the present disclosure provides a semiconductor device comprising: a substrate; a gate on the substrate; a source region and a drain region in the substrate on each side of the gate; and a dielectric wall in the substrate below the gate, the dielectric wall being substantially vertical to a substrate surface and being located between at least one of the source region and the drain region and a side surface of the gate corresponding to said at least one of the source region and the drain region, the upper end of the dielectric wall being lower than the substrate surface.

According to an implementation, there may be said dielectric walls on both sides of the gate, and the dielectric walls may be substantially aligned with two side surfaces of the gate respectively.

According to an implementation, the substrate may further comprise light doped regions which respectively correspond to the source region and the drain region, and a ratio of the depth of the upper end of the dielectric wall from the substrate surface to the depth of the light doped regions in the substrate may be between 0.5 and 2.

According to an implementation, each of the source region and the drain region may be a heavy doped region, and a ratio of a distance between the lower end of the dielectric wall and the upper end of the dielectric wall to the depth of the heavy doped region in the substrate may be between 0.8 and 2.

According to an implementation, the dielectric wall may comprise one of an oxide of silicon, a nitride of silicon and an oxynitride of silicon.

According to an implementation, the depth of the upper end of the dielectric wall from the substrate surface may be between 15 nm and 50 nm, and the height of the dielectric wall may be between 0.07 μm and 0.3 μm.

The present disclosure also provides a method for fabricating a semiconductor device comprising steps of: forming a side cliff in a substrate in accordance with a gate mask pattern, the side cliff being substantially vertical to a substrate surface; forming a dielectric layer on the substrate that comprises the side cliff; etching the dielectric layer to have the dielectric layer left only on the side cliff, as a dielectric wall; and burying the side cliff by a substrate growth, the burying is performed up to a level higher than the upper end of the dielectric wall.

According to an implementation, the step of forming the side cliff in the substrate may comprise forming on the substrate a protrusion having two said side cliffs which corresponds to the gate mask pattern.

According to an implementation, the substrate may comprise a first portion having a first crystal orientation and a second portion having a second crystal orientation which are laminated in order, and the step of forming on the substrate the protrusion having two said side cliffs which corresponds to the gate mask pattern may comprise removing portions of the first portion other than a portion which corresponds to the gate mask pattern.

According to an implementation, in the step of burying the side cliff by a substrate growth, a substrate material having the first crystal orientation may be grown between two dielectric walls.

According to an implementation, the first crystal orientation may be a <100> crystal orientation, the second crystal orientation may be a <110> crystal orientation, and the method for fabricating the semiconductor device may be for forming an NMOS transistor; or the first crystal orientation may be a <110> crystal orientation, the second crystal orientation may be a <100> crystal orientation, and the method for fabricating the semiconductor device may be for forming an PMOS transistor.

According to an implementation, the step of removing portions of the first portion other than a portion which corresponds to the gate mask pattern may comprise: forming a buffer layer on the first portion; forming a resist layer on the buffer layer; and etching portions of the first portion other than a portion which corresponds to the gate mask pattern by using the gate mask pattern. The step of burying the side cliff by the substrate growth may comprise: growing a substrate material having the second crystal orientation in regions other than that between the two dielectric walls; removing the buffer layer; and growing the substrate material having the first crystal orientation between the two dielectric walls.

According to an implementation, the step of removing portions of the first portion other than a portion which corresponds to the gate mask pattern may comprise: forming a buffer layer on the first portion; forming a resist layer on the buffer layer; and etching portions of the first portion other than a portion which corresponds to the gate mask pattern by using the gate mask pattern. The step of burying the side cliff by the substrate growth may comprise: removing the buffer layer; and growing a substrate material having the second crystal orientation in regions other than that between the two dielectric walls, and growing the substrate material having the first crystal orientation between the two dielectric walls.

According to an implementation, the step of forming the side cliff in the substrate may comprise: forming in the substrate a cave having two said side cliffs which corresponds to the gate mask pattern.

According to an implementation, the substrate may comprise a first portion having a first crystal orientation and a second portion having a second crystal orientation which are laminated in order, and the step of forming in the substrate the cave having two said side cliffs which corresponds to the gate mask pattern may comprise removing a portion of the first portion which corresponds to the gate mask pattern to expose the second portion.

According to an implementation, in the step of burying the side cliff by the substrate growth, a substrate material having the second crystal orientation may be grown between two dielectric walls.

According to an implementation, the first crystal orientation may be a <100> crystal orientation, the second crystal orientation may be a <110> crystal orientation, and the method for fabricating the semiconductor device may be for forming an PMOS transistor; or the first crystal orientation may be a <110> crystal orientation, the second crystal orientation may be a <100> crystal orientation, and the method for fabricating the semiconductor device may be for forming an NMOS transistor.

According to an implementation, the step of removing a portion of the first portion which corresponds to the gate mask pattern to expose the second portion may comprise: forming a buffer layer on the first portion; forming a resist layer on the buffer layer; and etching a portion of the first portion which corresponds to the gate mask pattern by using the gate mask pattern, to expose the second portion. The step of burying the side cliff by the substrate growth may comprise growing a substrate material having the second crystal orientation between the two dielectric walls; removing the buffer layer; and growing the substrate material having the first crystal orientation in regions other than that between the two dielectric walls.

According to an implementation, the step of removing a portion of the first portion which corresponds to the gate mask pattern to expose the second portion may comprise: forming a buffer layer on the first portion; forming a resist layer on the buffer layer; and etching a portion of the first portion which corresponds to the gate mask pattern by using the gate mask pattern, to expose the second portion. The step of burying the side cliff by the substrate growth may comprise removing the buffer layer; and growing the substrate material having the first crystal orientation in regions other than that between the two dielectric walls, and growing a substrate material having the second crystal orientation between the two dielectric walls.

According to an implementation, the method can further comprise forming a gate, a source and a drain in the substrate.

By virtue of the semiconductor device and the method for fabricating the semiconductor device of the present disclosure, for field effect transistors with small dimensions, the dielectric wall may mitigate or block the lateral diffusion of dopants in the source and drain regions, to thereby reduce the affects by the short channel effect.

Furthermore, the inventor of the present invention have also found that by virtue of the dielectric wall according to the present disclosure, even if a large doping concentration is adopted for the source and drain regions (or the doping concentration difference between the source and drain regions and the channel is increased) to obtain a low resistance value in the source region and the drain region, the lateral diffusion of dopants in the source and drain regions is not deteriorated. Thereby, even in the case of the short-channel device, the lateral diffusion of dopants in the source and drain regions can be reduced while low resistance value is obtained in the source region and the drain region. Therefore, according to the present invention, it becomes possible that carrier mobility is increased while preventing from increase of leakage current or channel punch-through.

In addition, the inventor of the present invention have also found that since the dielectric wall according to the present disclosure can well solve the problem of the lateral diffusion of dopants in the source and drain regions without increasing the resistance value of the source and drain regions, improvement of other performances of the device can be more sufficiently taken into consideration in designing the device. Thereby restriction to the improvement of performances of the device is reduced, enabling the production of short channel devices with higher performance (for example, higher speed, lower junction capacitance, lower junction leakage current and the like).

In addition, according to some preferable embodiments of the present disclosure, it is possible to selectively use different exemplary processes according to the present disclosure for the purpose of selection of crystal orientation of material for the channel, and thereby the channel region formed of material of a desired crystal orientation can be obtained by selecting processes in a case where the substrate is formed by laminating material of different crystal orientations.

Further features and their technical effects of the present invention will be apparent from the following exemplary embodiments with reference to the drawings.

BRIEF DESCRIPTION OF THE DRAWINGS

In the figures of the drawings, the present invention is illustrated by example instead of by limitation. In these drawings, like reference signs denote similar elements, in which.

DESCRIPTION OF THE EMBODIMENTS

Figure 1A:
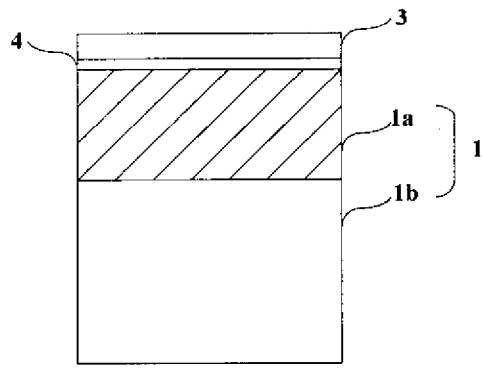
FIGS. 1a-1f are schematic cross-sectional views for explaining the process of fabricating a semiconductor device according to an embodiment of the present disclosure.

Now the embodiments of the present disclosure will be described in detail with reference to the drawings.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

First Embodiment

Figure 3A:
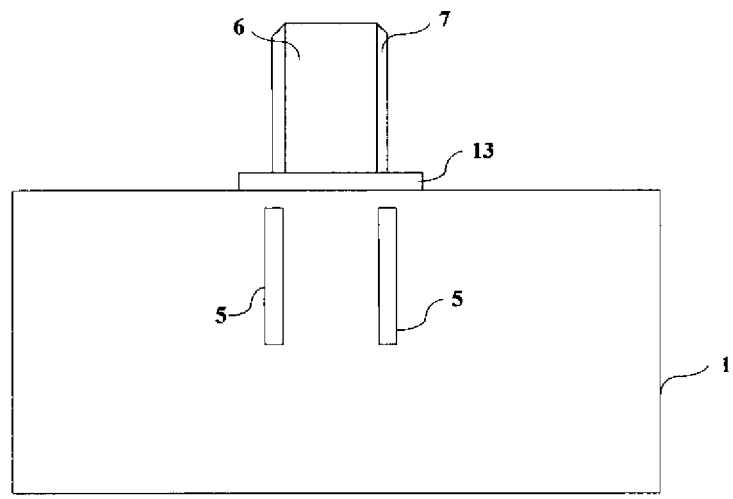
FIGS. 3a-3d show an exemplary example of a process of forming a gate, a source and a drain on a substrate that contains dielectric walls according to the present disclosure.
Figure 3B:
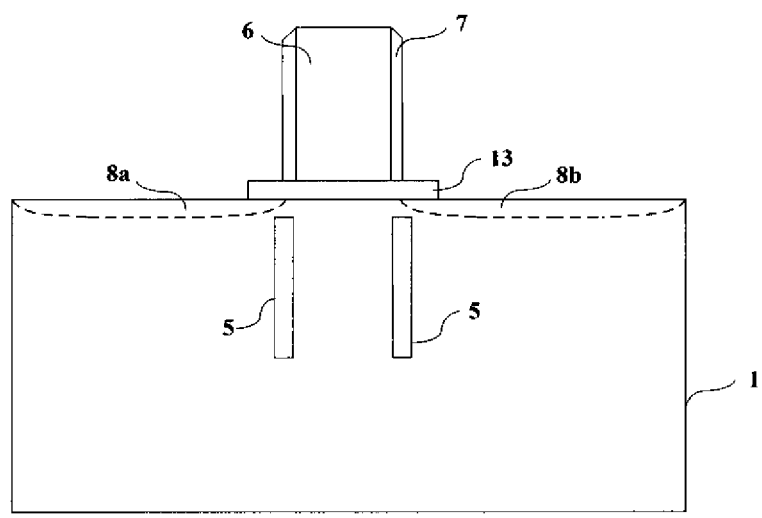
Figure 3C:
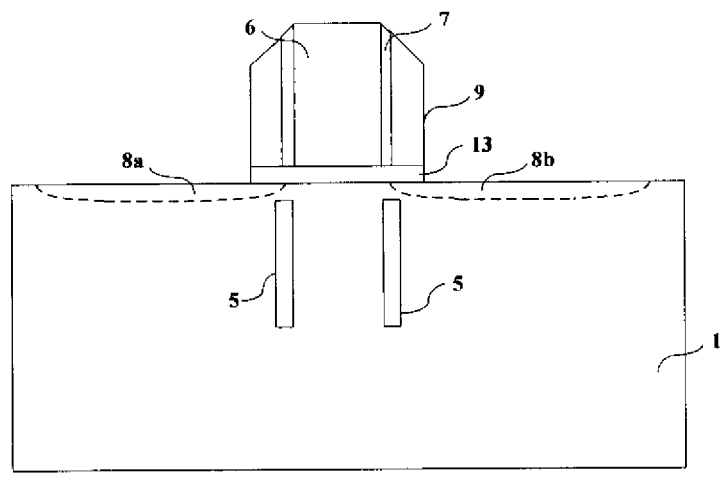
Figure 3D:
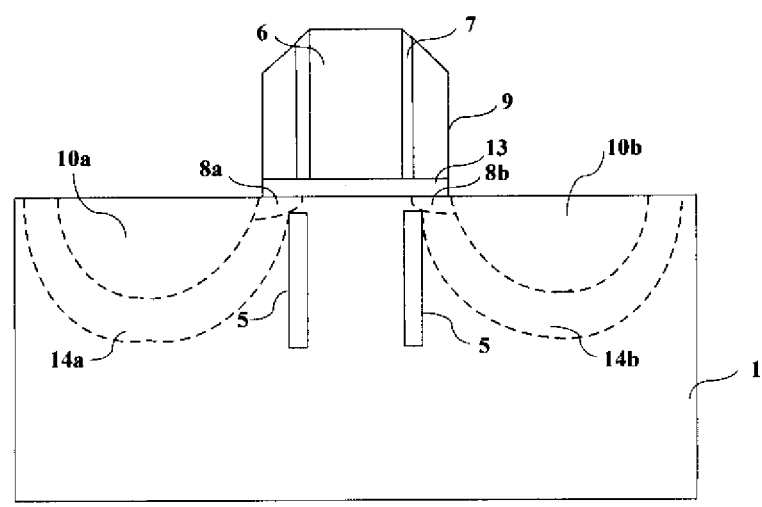

FIG. 3d shows a schematic cross-sectional view of a semiconductor device of the first embodiment of the present disclosure. The semiconductor device can be for example a field effect transistor (for example, a metal-oxide-semiconductor field effect transistor). The semiconductor device can comprise: a substrate 1, a gate 6 on the substrate 1, a source region 10a and a drain region 10b in the substrate 1 which are located on both sides of the gate 6 respectively, and dielectric walls 5 in the substrate 1 under the gate 6.

The dielectric wall 5 can be substantially vertical to a surface of the substrate 1 and can be located between at least one of source region 10a and the drain region 10b and a side surface of the gate corresponding to said at least one. In the present disclosure, the source region 10a and the drain region 10b refer to heavy doped regions of the source and the drain, respectively. The source can comprise a source region 10a and a light doped region 8a, and the drain can comprise a drain region 10b and a light doped region 8b. According to an implementation of the present embodiment, the dielectric wall 5 on the source region 10a side can be substantially aligned with the side surface of the gate 6 and shifted slightly toward the source region 10a and the dielectric wall 5 on the drain region 10b side can be substantially aligned with the side surface of the gate 6 and shifted slightly toward the drain region 10b.

The substrate 1 can also comprise for example a light doped region (LDD) 8a for the source and a light doped region 8b for the drain.

The dielectric wall 5 in the substrate on both the source side and the drain side can block, at least partially, lateral diffusion of dopants in the depletion layer 14a of the source region (heavy doped region) 10a and dopants in the depletion layer 14b of the drain region (heavy doped region) 10b, prevent the mixture of the dopants in the depletion layer 14a and the depletion layer 14b with each other, and thereby alleviate the affects by the short channel effect. Furthermore, the upper ends of the dielectric walls 5 are below the substrate surface, and therefore the dielectric walls 5 will not hinder the formation of channel between the source and the drain.

According to one implementation of the present embodiment, the substrate 1 can be for example a silicon substrate, a substrate of a mixture of silicon and germanium, a substrate of a mixture of silicon and carbon or a substrate of other known material. Those skilled in the art may also select applicable substrate material according to need. The source and the drain can be for example doped regions which have a conductivity type opposite to the silicon substrate. For an NMOS transistor, the dopant material for the source and the drain can include a group-V element such as phosphorus or arsenic, and the dopant material for the channel region can include a group-III element such as boron, gallium or indium. For a PMOS transistor, the dopant material for the source and the drain can include a group-III element such as boron, gallium or indium, and the dopant material for the channel region can include a group-V element such as phosphorus or arsenic. The gate 6 can be for example but is not limited to a metal gate, a poly-silicon gate or a dummy gate. The dielectric walls 5 can contain dielectric as the main component. In a case where the substrate 1 contains silicon, the dielectric can preferably be at least one of an oxide of silicon, a nitride of silicon and an oxynitride of silicon.

FIG. 3d shows a case where there are dielectric walls 5 on both sides of the gate 6. However, the present invention is not limited to the case of dielectric walls 5 on both source region side and drain region side of the gate 6. According to one implementation of the present embodiment, it is possible that there is a dielectric wall 5 on only one of the source region side and drain region side. In this case, since the dielectric wall 5 blocks the lateral diffusion of the dopants of the depletion layer of one of the source region and the drain region, at least one effect caused by the short channel effect can also be alleviated.

According to one implementation of the present embodiment, the ratio of the height of the dielectric wall 5 (the distance between the lower end and upper end of the dielectric wall 5) to the depth of the heavy doped regions in the substrate can be for example between 0.8 and 2. The depth of the heavy doped regions can be determined by determining the junction depths of the source region 10a and the drain region 10b. In this case, the dielectric walls 5 can block most lateral diffusion of the depletion region 14a and 14b of the source region 10a and the drain region 10b.

In addition, the ratio of the depth of the upper end of the dielectric wall 5 from the surface of the substrate 1 to the depth of the light doped regions 8a and 8b in the substrate 1 can be for example between 0.5 and 2. In this case, the dielectric walls 5 can block most lateral diffusion of the depletion region 14a and 14b of the source region 10a and the drain region 10b without large influence on formation of the channel.

The depth of the upper end of the dielectric wall 5 from the surface of the substrate 1 can be for example approximately between 15 nm and 50 nm, and the height of the dielectric wall can be for example approximately between 0.07 μm and 0.3 μm.

According to one implementation of the present embodiment, the metal-oxide-semiconductor field effect transistor can also comprise for example offsets 7 and spacers 9 on each side of the gate, and a gate oxide layer 13 between the gate 6 and the substrate 1. Many gate layouts have been known in the prior art. Although FIG. 3d gives an exemplary layout of the gate region, the metal-oxide-semiconductor field effect transistor can adopt any layout of the gate region, as long as the substrate 1 contains the dielectric walls 5 as described above.

With the semiconductor device according to the present embodiment, in the substrate there are dielectric walls 5 which are substantially aligned with the edges of the gate mask pattern on both the source and drain sides, and thereby the lateral diffusion of the dopants in the source region and the drain region can be blocked.

According to the present embodiment, the light doped regions and the heavy doped regions can be respectively formed by adopting for example an ultra shallow junction (USJ) method. In this case, the process according to the present embodiment can extend the room to improve the performance of the ultra shallow junction (USJ) method.

Second Embodiment

FIGS. 1a to 1f are schematic cross-sectional views for explaining the process of fabricating a semiconductor device according to the second embodiment of the present disclosure. Such a fabrication process can be used to fabricate the semiconductor device as shown in FIG. 3d. The materials, constructions and dimensions and the like of elements described in the first embodiment can be applied to the present embodiment as well, but are not limitations to the present embodiment.

As shown in FIG. 1a, a substrate 1 is prepared, and a buffer layer 4 and a resist layer 3 are formed on the substrate 1. The substrate 1 can be for example a silicon substrate, a substrate of a mixture of silicon and germanium, a substrate of a mixture of silicon and carbon or a substrate of other appropriate material. The skilled in the art may also select applicable substrate material according to need. According to one implementation of the present embodiment, the substrate 1 can comprise a first portion 1a having a first crystal orientation and a second portion 1b having a second crystal orientation which are laminated in order, wherein the first crystal orientation can be different from the second crystal orientation. The buffer layer 4 can be for example a silicon oxide or a lamination of a silicon nitride and a silicon oxide. Although the buffer layer 4 can improve etching performance, it is also possible if this buffer layer 4 is not formed. In this embodiment, the resist layer 3 can be for example a positive resist layer. The first portion 1a and the second portion 1b can contact with each other directly, or can have an oxide layer interposed there between.

Figure 1B:
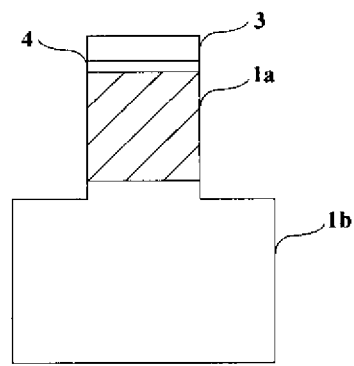

Then, the above mentioned resist layer is patterned in accordance with a gate mask pattern (for example, the same mask as the gate self-alignment mask or a mask of the size slightly greater than the gate self-alignment mask can be used). Then the substrate 1 is etched by using the resist pattern formed by the patterning, to form a modality as shown in FIG. 1b. An anisotropy etching, for example a dry etching or a combination of a dry etching and a wet etching or any appropriate etching method, can be used here. According to an implementation of the present embodiment, a plasma etching can be used.

As shown in FIG. 1b, side cliffs which are substantially vertical to the surface of the substrate 1 are formed in the substrate. More specifically, according to the present embodiment, a protrusion which has two said side cliffs (that is, the vertical outer surface of the two steps of the protrusion) and which corresponds to the gate mask pattern is formed on the substrate 1 by etching. Here, the etching depth is controlled so that the etching depth (that is, the height of the protrusion or the difference in levels of the steps) is comparable to the junction depth of a source region and a drain region to be formed later. For example, the etching depth can be controlled so that a ratio of a depth of the etched surface from the original substrate surface to the junction depth of the source and drain regions to be formed in the substrate (that is, the depth of the heavy doped regions) is between 0.8 and 2. Although FIG. 1b shows that the substrate is etched so that the second portion 1b of the substrate 1 is exposed, it is also possible that the second portion 1b of the substrate 1 is not exposed. It is sufficient if the etching depth is comparable to the junction depth of the source and drain regions to be formed later or has substantially the above mentioned specific relationship thereto.

Thereafter, although not shown, a shallow trench isolation (STI) can be performed in a case where a plurality of semiconductor devices are fabricated at the same time.

Figure 1C:
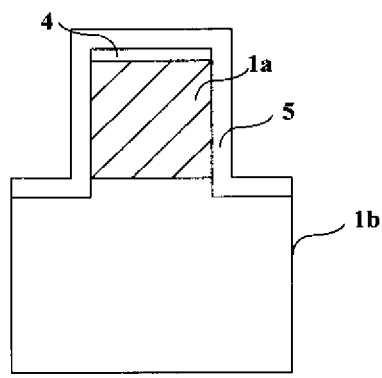

Then, the resist layer 3 is removed, and a dielectric layer 5 is formed on the substrate 1, as shown in FIG. 1c. The dielectric layer 5 can be formed by for example a thermal oxide growth method or a deposition method, preferably a chemical vapor deposition (CVD) method. In a case where the substrate 1 is a silicon substrate, the dielectric layer 5 can be formed of for example at least one of an oxide of silicon, a nitride of silicon and an oxynitride of silicon.

Figure 1D:
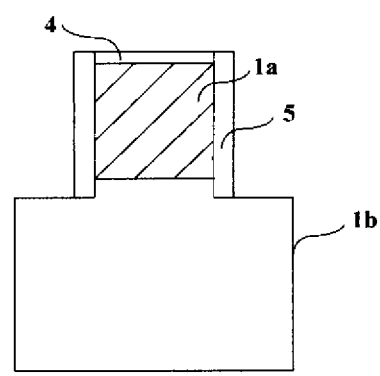

Then, as shown in FIG. 1d, the dielectric layer 5 is etched so that the dielectric layer 5 is only left on said side cliffs as dielectric walls 5. That is to say, the dielectric layer 5 other than the dielectric layer 5 on the side cliffs is removed. The thickness of the dielectric walls 5 can be controlled in the range of 3 nm to 30 nm, and the width of the dielectric walls 5 can be controlled in the range of 3 nm to 100 nm. The etching performed on the dielectric layer 5 can be an anisotropy etching, for example a dry etching.

After that, the side cliffs are buried by using a substrate growth. The level until which the burying is performed is higher than the upper ends of the dielectric walls.

Figure 1E:
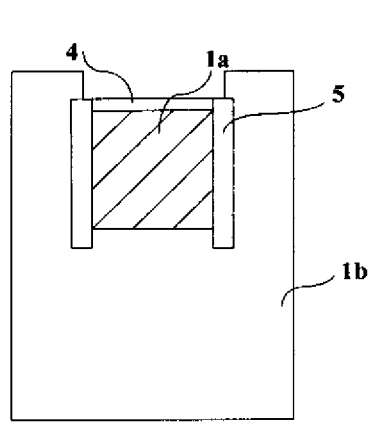
Figure 1F:
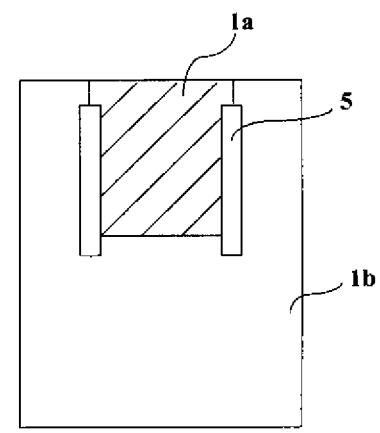

More specifically, as shown in FIG. 1e, in the substrate region other than that between the two dielectric walls 5 (that is, in the substrate region further from the gate than the dielectric walls 5 in the horizontal direction), a substrate material is grown so that the substrate material which has been grown is higher than the upper end of the dielectric walls 5. Although FIG. 1e shows that the grown substrate material is a material having the second crystal orientation in a case where the etching in FIG. 1b causes the second portion 1b to be exposed, the grown substrate material can be a material having the first crystal orientation in a case where the etching in FIG. 1b does not cause the second portion 1b to be exposed. Then, the buffer layer 4 is removed, and the substrate material having the first crystal orientation is grown in the substrate region between the two dielectric walls 5 (that is, in the substrate region which is closer to the gate than the dielectric walls 5 in the horizontal direction), so that the grown substrate material is higher than the upper end of the dielectric walls 5, as shown in FIG. 1f. As a result, the side cliffs are buried in the substrate which has been grown. After that, a method such as a chemical mechanical planarization can be used to process the substrate surface, so that a ratio of the distance of the upper end of the dielectric wall 5 from the processed substrate surface to the depth of the light doped regions of the source and drain to be formed (the junction depth of the light doped regions) is between 0.5 and 2.

The side cliffs can also be buried by using a method different from that shown in FIG. 1e. More specifically, the buffer layer 4 is first removed. Then in the substrate region other than that between the two dielectric walls 5 (that is, in the substrate region further from the gate than the dielectric walls 5 in the horizontal direction), a substrate material is grown (which can be, depending on the etching depth in the FIG. 1b, the material having the first crystal orientation or the material having the second crystal orientation, as described above), and in the substrate region between the two dielectric walls 5 (that is, in the substrate region closer to the gate than the dielectric walls 5 in the horizontal direction), the substrate material having the first crystal orientation is grown, so that the substrate materials which have been grown are both higher than the upper ends of the dielectric walls 5. Thereby the side cliffs are buried in the substrate materials which have been grown. Thereafter, a method such as a chemical mechanical planarization can be used to process the substrate surface, so that the distance between the upper ends of the dielectric walls 5 and the processed substrate surface is comparable to the depth of the light doped regions of the source and drain to be formed (the junction depth of the light doped regions). For example, a ratio of the distance of the upper ends of the dielectric walls 5 from the processed substrate surface to the depth of the light doped regions of the source and drain to be formed (the junction depth of the light doped regions) can be between 0.5 and 2.

As a matter of course, in the case where the buffer layer 4 is not formed on the substrate 1 as mentioned above, the step of removing the butter layer 4 is not included.

By the above processes of the present embodiment, the dielectric walls 5 which are substantially aligned with the edges of the gate mask pattern at the source and drain sides can be formed in the substrate, as shown in FIG. 1f. Thereby the lateral diffusion of the dopants in depletion regions of the source region and the drain region can be blocked, alleviating at least one affect caused by the short channel effect.

In addition, by the above processes of the present embodiment, in a case where the substrate has the first portion 1a and the second portion 1b of different crystal orientations as shown in FIG. 1a, the channel region can be formed in the first portion 1a of the substrate by adopting the above processes in the second embodiment. For example, in a case where the first portion 1a is a substrate material having a <100> crystal orientation and the second portion 1b is a substrate material having a <110> crystal orientation, the fabrication processes in the second embodiment can be used to form an NMOS transistor so that the channel of the NMOS transistor is formed of the material having the <100> crystal orientation, to thereby achieve a better channel performance of the transistor. Similarly, in a case where the first portion 1a is a substrate material having a <110> crystal orientation and the second portion 1b is a substrate material having a <100> crystal orientation, the fabrication processes in the second embodiment can be used to form a PMOS transistor so that the channel of the PMOS transistor is formed of the material having the <110> crystal orientation, to thereby achieve a better channel performance of the transistor.

Although the substrate 1 can comprise the first portion 1a having the first crystal orientation and the second portion 1b having the second crystal orientation which are laminated in order, the present embodiment can also be used for forming the dielectric walls 5 in a substrate 1 having a uniform crystal orientation. In this case, the channel is formed of the material having the same crystal orientation no matter whether a PMOS transistor or an NMOS transistor is to be formed.

As described above, the substrate 1 having the dielectric walls 5 therein as shown in FIG. 1f has been formed. Then, a gate can be formed on the substrate 1 having the dielectric walls 5 therein, and the source and the drain can be formed in the substrate 1. There are many methods known in the art for forming a gate on a substrate and for forming a source and a drain in the substrate, and therefore the processes of forming the gate, the source and the drain in the present invention are not limited to any particular processes. FIGS. 3a to 3d show an exemplary example of the processes of forming the gate, the source and the drain. However, it should be noted that the processes of forming the gate, the source and the drain in the present invention are not limited to the specific processes shown in FIGS. 3a to 3d. Furthermore, the processes described with reference to FIG. 1a to 1f in the foregoing can be deemed as a semiconductor device fabrication method such as for processing the substrate.

In the FIGS. 3a to 3d, the first portion 1a and the second portion 1b of the second embodiment are shown without discrimination. In practice, as described in the foregoing, the substrate 1 in the FIGS. 3a to 3d can be formed by laminating the first portion 1a and the second portion 1b, or can be a substrate having a single crystal orientation.

Since each single process of the processes in FIGS. 3a to 3d is well-known by the skilled in the art, only a brief and summarized description will be given below.

As shown in FIG. 3a, a gate oxide layer 13 is formed on the substrate 1, and a gate 6 is formed on the gate oxide layer. The gate 6 can be for example a metal gate, a poly-silicon gate or a dummy gate. Then, offsets 7 are formed on both sides of the gate 6.

After that, as shown in FIG. 3b, light dopant implantation is performed on both source and drain sides (for short channel devices, a pocket implantation can also be performed for the channel region), to form light doped regions 8a and 8b.

Then spacers 9 are formed on the both sides of the gate 6, as shown in FIG. 3c.

After the spacers 9 are formed on the both sides of the gate 6, heavy dopant implantation is performed on the source and drain sides to form a source region 10a and a drain region 10b (that is, heavy doped regions), as shown in FIG. 3d.

According to the present embodiment, the light doped regions and the heavy doped regions can be respectively formed by adopting for example an ultra shallow junction (USJ) method. In this case, the process according to the present embodiment can extend the room to improve the performance of the ultra shallow junction (USJ) method.

By the above described processes of the present embodiment, as shown in FIG. 3d, the dielectric wall 5 may block the lateral diffusion of dopants (in depletion regions) in the source and drain regions.

In addition, in a case where the substrate has the first portion 1a and the second portion 1b having different crystal orientations as shown in FIG. 1a, the above described processes of the second embodiment enable the channel to be formed of material with desired crystal orientation.

Third Embodiment

FIGS. 2a to 2f are schematic cross-sectional views for explaining the process of fabricating a semiconductor device according to the third embodiment of the present disclosure. Such a fabrication process can also be used to fabricate the semiconductor device as shown in FIG. 3d. The materials, constructions and dimensions and the like of the elements described in the first embodiment can be applied to the present embodiment as well, but are not limitations to the present embodiment.

Figure 2A:
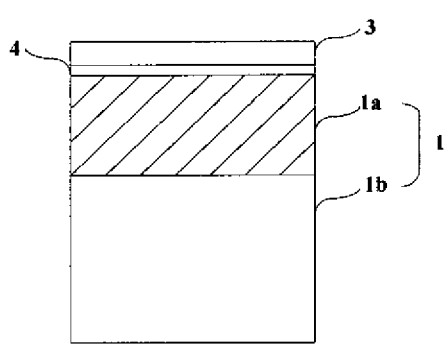
FIGS. 2a-2f are schematic cross-section views for explaining the process of fabricating a semiconductor device according to another embodiment of the present disclosure.

As shown in FIG. 2a, a substrate 1 is prepared, and a buffer layer 4 and a resist layer 3 are formed on the substrate 1. The substrate 1 can be for example a silicon substrate, a substrate of a mixture of silicon and germanium, a substrate of a mixture of silicon and carbon or a substrate of other appropriate material. The skilled in the art may also select applicable substrate material according to need. According to one implementation of the present embodiment, the substrate 1 can comprise a first portion 1a having a first crystal orientation and a second portion 1b having a second crystal orientation which are laminated in order, wherein the first crystal orientation can be different from the second crystal orientation. The buffer layer 4 can be for example a silicon oxide or a lamination of a silicon nitride and a silicon oxide. Although the buffer layer 4 can improve etching performance, it is also possible if this buffer layer 4 is not formed. In this embodiment, the resist layer 3 can be for example a negative resist layer. The first portion 1a and the second portion 1b can contact with each other directly, or can have an oxide layer interposed there between.

Figure 2B:
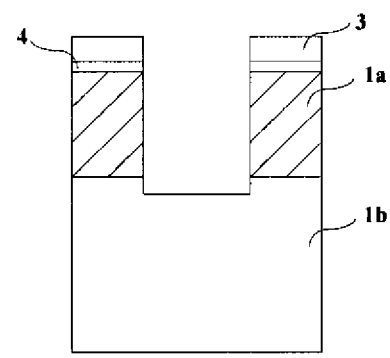

Then, the above mentioned resist layer is patterned in accordance with a gate mask pattern (for example, the same mask as the gate self-alignment mask or a mask of the size slightly greater than the gate self-alignment mask can be used). Then the substrate 1 is etched by using the resist pattern formed by the patterning, to form a modality as shown in FIG. 2b. An anisotropy etching, for example a dry etching or a combination of a dry etching and a wet etching or any appropriate etching method, can be used here. According to an implementation of the present embodiment, a plasma etching can be used.

As shown in FIG. 2b, side cliffs which are substantially vertical to the surface of the substrate 1 are formed in the substrate. More specifically, according to the present embodiment, a cave which has two said side cliffs (that is, the vertical inner surfaces of the two steps of the cave) and which corresponds to the gate mask pattern is formed in the substrate 1 by etching. Here, the etching depth is controlled so that the etching depth (that is, the depth of the cave or the difference in levels of the steps) is comparable to the junction depth of a source region and a drain region to be formed later. For example, the etching depth can be controlled so that a ratio of a depth of the etched surface from the original substrate surface to the junction depth of the source and drain regions to be formed in the substrate (that is, the depth of the heavy doped regions) is approximately between 0.8 and 2. According to one implementation of the present embodiment, the etching depth can be controlled so that the second portion 1b is exposed, so that a channel can be formed of a substrate material which has the same crystal orientation as that of the second portion 1b.

Thereafter, although not shown, a shallow trench isolation (STI) can be performed in a case where a plurality of semiconductor devices are fabricated at the same time.

Figure 2C:
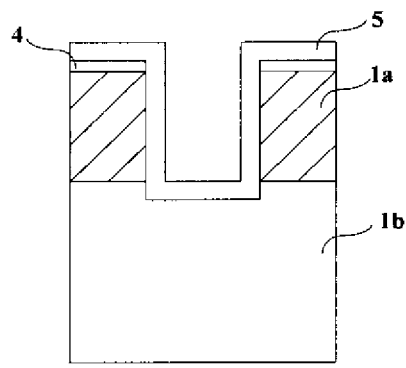

Then, the resist layer 3 is removed, and a dielectric layer 5 is formed on the substrate 1, as shown in FIG. 2c. The dielectric layer 5 can be formed by for example a thermal oxide growth method or a deposition method, preferably a chemical vapor deposition (CVD) method. In a case where the substrate 1 is a silicon substrate, the dielectric layer 5 can be formed of for example at least one of an oxide of silicon, a nitride of silicon and an oxynitride of silicon.

Figure 2D:
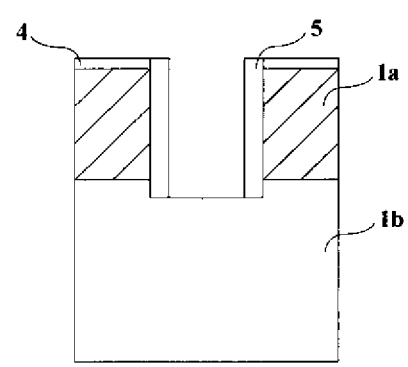

Then, as shown in FIG. 2d, the dielectric layer 5 is etched so that the dielectric layer 5 is only left on said side cliffs as dielectric walls 5. That is to say, the dielectric layer 5 other than the dielectric layer 5 on the side cliffs is removed. The thickness of the dielectric walls 5 can be controlled in the range of 3 nm to 30 nm, and the width of the dielectric walls 5 can be controlled in the range of 3 nm to 100 nm. The etching performed on the dielectric layer 5 can be an anisotropy etching, for example a dry etching.

After that, the side cliffs are buried by using a substrate growth. The level until which the burying is performed is higher than the upper end of the dielectric walls.

Figure 2E:
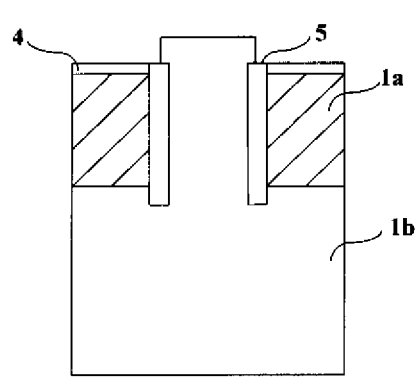
Figure 2F:
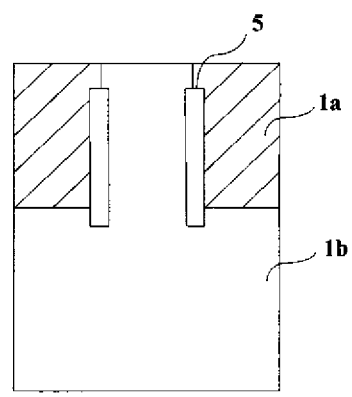

More specifically, as shown in FIG. 2e, in the substrate region between the two dielectric walls 5 (that is, in the substrate region closer to the gate than the dielectric walls 5 in the horizontal direction), a substrate material having the second crystal orientation is grown so that the substrate material which has been grown is higher than the upper end of the dielectric walls 5. Then, the buffer layer 4 is removed, and the substrate material having the first crystal orientation is grown in the substrate region other than that between the two dielectric walls 5 (that is, in the substrate region which is further from the gate than the dielectric walls 5 in the horizontal direction), so that the grown substrate material is higher than the upper end of the dielectric walls 5, as shown in FIG. 2f. As a result, the side cliffs are buried in the substrate which has been grown. After that, a method such as a chemical mechanical planarization can be used to process the substrate surface, so that a ratio of the distance of the upper end of the dielectric wall 5 from the processed substrate surface to the depth of the light doped regions of the source and drain to be formed (the junction depth of the light doped regions) is between 0.5 and 2.

The side cliffs can also be buried by using a method different from that shown in FIG. 2e. More specifically, the buffer layer 4 is first removed. Then in the substrate region other than that between the two dielectric walls 5 (that is, in the substrate region further from the gate than the dielectric walls 5 in the horizontal direction), a substrate material having the first crystal orientation is grown, and in the substrate region between the two dielectric walls 5 (that is, in the substrate region closer to the gate than the dielectric walls 5 in the horizontal direction), the substrate material having the second crystal orientation is grown, so that the substrate materials which have been grown are both higher than the upper ends of the dielectric walls 5. Thereby the side cliffs are buried in the substrate materials which have been grown. Thereafter, a method such as a chemical mechanical planarization can be used to process the substrate surface, so that the distance between the upper ends of the dielectric walls 5 and the processed substrate surface is comparable to the depth of the light doped regions of the source and drain to be formed (the junction depth of the light doped regions). For example, a ratio of the distance of the upper ends of the dielectric walls 5 from the processed substrate surface to the depth of the light doped regions of the source and drain to be formed (the junction depth of the light doped regions) can be between 0.5 and 2.

As a matter of course, in the case where the buffer layer 4 is not formed on the substrate 1 as mentioned above, the step of removing the butter layer 4 is not included.

By the above processes of the present embodiment, the dielectric walls 5 which are substantially aligned with the edges of the gate mask pattern on the source and drain sides can be formed in the substrate, as shown in FIG. 2f. Thereby the lateral diffusion of the dopants in depletion regions of the source region and the drain region can be blocked, alleviating at least one affect caused by the short channel effect.

In addition, by the above processes of the present embodiment, in a case where the substrate has the first portion 1a and the second portion 1b of different crystal orientations as shown in FIG. 2a, the channel region can be formed in the second portion 1b of the substrate by adopting the above processes in the third embodiment. For example, in a case where the first portion 1a is a substrate material having a <100> crystal orientation and the second portion 1b is a substrate material having a <110> crystal orientation, the fabrication processes in the third embodiment can be used to form an PMOS transistor so that the channel of the PMOS transistor is formed of the material having the <110> crystal orientation, to thereby achieve a better channel performance of the transistor. Similarly, in a case where the first portion 1a is a substrate material having a <110> crystal orientation and the second portion 1b is a substrate material having a <100> crystal orientation, the fabrication processes in the third embodiment can be used to form an NMOS transistor so that the channel of the NMOS transistor is formed of the material having the <100> crystal orientation, to thereby achieve a better channel performance of the transistor.

Although the substrate 1 can comprise the first portion 1a having the first crystal orientation and the second portion 1b having the second crystal orientation which are laminated in order as described above, the present embodiment can also be used for forming the dielectric walls 5 in a substrate 1 having a uniform crystal orientation. In this case, the channel is formed of the material having the same crystal orientation no matter whether a PMOS transistor or an NMOS transistor is to be formed.

As described above, the substrate 1 having the dielectric walls 5 therein as shown in FIG. 2f has been formed. Then, a gate can be formed on the substrate 1 having the dielectric walls 5 therein, and the source and the drain can be formed in the substrate 1. There are many methods known in the art for forming a gate on a substrate and for forming a source and a drain in the substrate, and therefore the processes of forming the gate, the source and the drain in the present invention are not limited to any particular processes. FIGS. 3a to 3d show an exemplary example of the processes of forming the gate, the source and the drain. However, it should be noted that the processes of forming the gate, the source and the drain in the present invention are not limited to the specific processes shown in FIGS. 3a to 3d. Furthermore, the processes described with reference to FIGS. 2a to 2f in the foregoing can be deemed as a semiconductor device fabrication method such as for processing the substrate.

In the FIGS. 3a to 3d, the first portion 1a and the second portion 1b of the third embodiment are shown without discrimination. In practice, as described in the foregoing, the substrate 1 in the FIGS. 3a to 3d can be formed by laminating the first portion 1a and the second portion 1b, or can be a substrate having a single crystal orientation.

Since each single process of the processes in FIGS. 3a to 3d is well-known by those skilled in the art, only a brief and summarized description will be given below.

As shown in FIG. 3a, a gate oxide layer 13 is formed on the substrate 1, and a gate 6 is formed on the gate oxide layer. The gate 6 can be for example a metal gate, a poly-silicon gate or a dummy gate. Then, offsets 7 are formed on both sides of the gate 6.

After that, as shown in FIG. 3b, light dopant implantation is performed on both source and drain sides (for short channel devices, a pocket implantation can also be performed for the channel region), to form light doped regions 8a and 8b.

Then spacers 9 are formed on the both sides of the gate 6, as shown in FIG. 3c.

After the spacers 9 are formed on the both sides of the gate 6, heavy dopant implantation is performed on the source and drain sides to form a source region 10a and a drain region 10b (that is, heavy doped regions), as shown in FIG. 3d.

According to the present embodiment, the light doped regions and the heavy doped regions can be respectively formed by adopting for example an ultra shallow junction (USJ) method. In this case, the process according to the present embodiment can extend the room to improve the performance of the ultra shallow junction (USJ) method.

By the above described processes of the present embodiment, as shown in FIG. 3d, the dielectric wall 5 may block the lateral diffusion of dopants (in depletion regions) in the source and drain regions.

In addition, in a case where the substrate has the first portion 1a and the second portion 1b having different crystal orientations as shown in FIG. 2a, the above described processes of the third embodiment enable the channel to be formed of material with desired crystal orientation.

Fourth Embodiment

In the second and third embodiments described with reference to FIGS. 1a to 1f, FIGS. 2a to 2f and FIGS. 3a to 3c, the source, the drain and the gate are formed after the dielectric wall 5 is buried in the substrate. However, it is also possible to first form the gate on the substrate, and then to bury the dielectric wall 5 in the substrate.

FIGS. 4a to 4f are schematic cross-sectional views for explaining the process of fabricating a semiconductor device according to the fourth embodiment of the present disclosure. Such a fabrication process can also be used to fabricate the semiconductor device as shown in FIG. 3d. The materials, constructions, dimensions, process details and the like of elements described in the first through third embodiments can be applied to the present embodiment as well, but are not limitations to the present embodiment. Elements which are the same as or similar to those in the first through third embodiments will not be repetitively described.

Figure 4A:
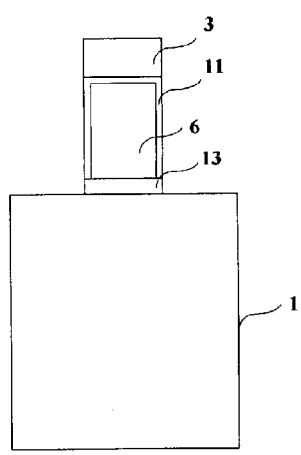
FIGS. 4a-4f are schematic cross-sectional views for explaining the process of fabricating a semiconductor device according to yet another embodiment of the present disclosure.

As shown in FIG. 4a, a substrate 1 is prepared, and a gate oxide layer 13, a gate 6, a protection layer 11 and a resist layer 3 which are laminated in order are formed on the substrate 1. The protection layer 11 can be a silicon oxide. In the present embodiment, the resist layer (resist pattern) 3 can be a positive resist layer.

Figure 4B:
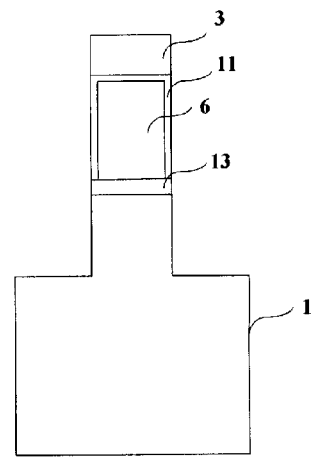

Then the substrate 1 is etched by using the resist pattern, to form a modality as shown in FIG. 4b. An anisotropy etching, for example a dry etching or a combination of a dry etching and a wet etching or any appropriate etching method, can be used here. According to an implementation of the present embodiment, a plasma etching can be used.

As shown in FIG. 4b, side cliffs which are substantially vertical to the surface of the substrate 1 are formed in the substrate. More specifically, according to the present embodiment, a protrusion which has two said side cliffs (that is, the vertical outer surface of the two steps of the protrusion) and which corresponds to the gate is formed on the substrate 1 by etching. Here, the etching depth is controlled so that the etching depth (that is, the height of the protrusion or the difference in levels of the steps) is comparable to the junction depth of a source region and a drain region to be formed later (the specific depth can be designed with reference to, for example, that in the first through third embodiment in the foregoing).

Thereafter, although not shown, a shallow trench isolation (STI) can be performed in a case where a plurality of semiconductor devices are fabricated at the same time.

Figure 4C:
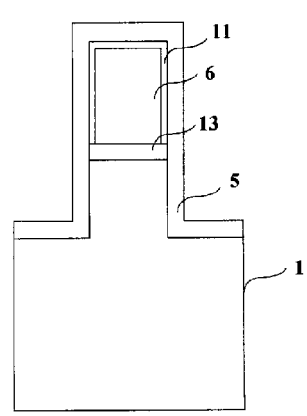

Then, the resist layer 3 is removed, and a dielectric layer 5 is formed on the substrate 1, as shown in FIG. 4c. The dielectric layer 5 can be formed by for example a thermal oxide growth method or a deposition method, preferably a chemical vapor deposition (CVD) method. In a case where the substrate 1 is a silicon substrate, the dielectric layer 5 can be formed of at least one of an oxide of silicon, a nitride of silicon and an oxynitride of silicon.

Figure 4D:
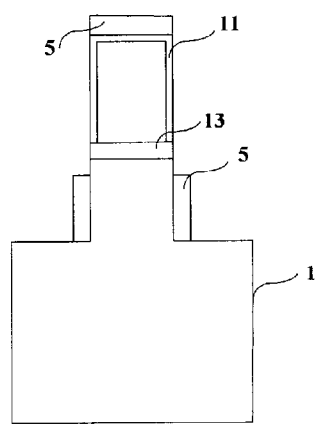

Then, the dielectric layer 5 is etched so that the dielectric layer 5 is only left on said side cliffs as dielectric walls 5. Furthermore, the dielectric layer 5 on the side cliffs are etched so that the upper ends of the dielectric walls 5 are below the upper surface of the substrate (the interface between the gate oxide layer and the substrate) and is at a predetermined distance from the upper surface of the substrate (the specific depth can be designed with reference to, for example, that in the first through third embodiment in the foregoing), as shown in FIG. 4d. The etching performed on the dielectric layer 5 can be an anisotropy etching, for example a dry etching.

After that, the dielectric walls 5 are buried by using a substrate growth. The level until which the burying is performed is higher than the upper end of the dielectric walls, and substantially levels the upper surface of the substrate, as shown in FIG. 4e.

Figure 4E:
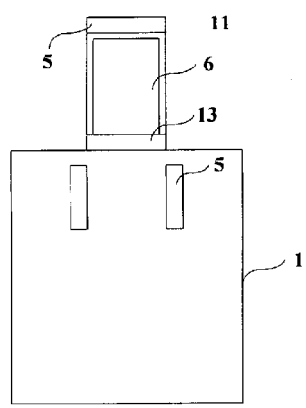
Figure 4F:
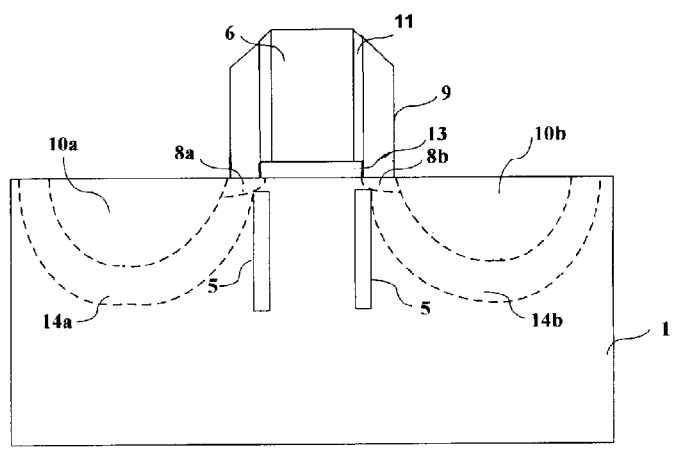

By the above described processes of the present embodiment, dielectric walls 5 which are substantially aligned with the edges of the gate mask pattern at the both source and drain sides can be formed in the substrate in which the gate 6 has been formed, as shown in FIG. 4e. Thereby the lateral diffusion of the dopants of the depletion regions of the source region and the drain region can be blocked, alleviating at least one affect caused by the short channel effect.

As described above, the substrate 1 which has the gate 6 formed thereon and the dielectric walls 5 formed therein as shown in FIG. 4e has been formed in which the protection layers 11 can function as the offsets 7 in structure shown in FIG. 3d. Then the spacers 9, the light doped regions 8a and 8b and the heavy doped regions (the source region and the drain region) 10a and 10b can be formed similarly to FIGS. 3b to 3d.

By virtue of the above processes of the present embodiment, a structure which is similar to that of the first embodiment can be formed, as shown in FIG. 4e. The dielectric walls 5 can block the lateral diffusion of the dopants (of the depletion region) of the source region and the drain region.

Although structures of a single semiconductor device (a single field effect transistor) and the processes for fabricating the same have been described with reference to the drawings, the foregoing structures and processes can be used for a plurality of semiconductor devices (a plurality of field effect transistors) in an array of semiconductor devices. In this case, the above described processes can be performed at the same time respectively on a plurality of semiconductor devices on a same substrate.

Although the present invention has been described with reference to the above four exemplary embodiments, it should be noted that the present invention is not limited to the disclosed exemplary embodiments. The scopes of the following claims should be accorded with the broadest interpretation so as to cover all modifications and equivalent structures and functions.

What is claimed is:

1. A semiconductor device, comprising:
a hybrid orientation substrate, containing a first portion having a first crystal orientation and a second portion having a second crystal orientation different from the first crystal orientation, the first and second portions being laminated and formed from the same semiconductor material;
a gate on the substrate;
a source region and a drain region in the substrate on each side of the gate; and
a dielectric wall in the substrate below the gate, the dielectric wall being substantially vertical to a substrate surface and being located between at least one of the source region and the drain region and a side surface of the gate corresponding to said at least one of the source region and the drain region, the upper end of the dielectric wall being lower than the substrate surface;
wherein the crystal orientations of the source and drain regions are the same as one of the first and second crystal orientations, and the crystal orientation of a channel region below the gate and between the source and drain regions is the same as the other of the first and second crystal orientations; and wherein the source and drain regions and the channel region are formed from the same semiconductor material as the substrate.

2. The semiconductor device according to claim 1, wherein there are said dielectric walls on both sides of the gate, and the dielectric walls are substantially aligned with two side surfaces of the gate respectively.

3. The semiconductor device according to claim 1, wherein the substrate further comprises light doped regions which respectively correspond to the source region and the drain region, and a ratio of the depth of the upper end of the dielectric wall from the substrate surface to the depth of the light doped regions in the substrate is between 0.5 and 2.

4. The semiconductor device according to claim 1, wherein each of the source region and the drain region is a heavy doped region, and a ratio of a distance between the lower end of the dielectric wall and the upper end of the dielectric wall to the depth of the heavy doped region in the substrate is between 0.8 and 2.

5. The semiconductor device according to claim 1, wherein the dielectric wall comprises one of an oxide of silicon, a nitride of silicon and an oxynitride of silicon.

6. The semiconductor device according to claim 1, wherein the depth of the upper end of the dielectric wall from the substrate surface is between 15 nm and 50 nm, and the height of the dielectric wall is between 0.07 µm and 0.3 µm.

* * * * *